United States Patent [19]

Raggenbass et al.

[11] 4,214,177
[45] Jul. 22, 1980

[54] MONITORING CIRCUIT

[75] Inventors: Werner Raggenbass, Schwerzenbach; Kurt Zwar, Brugg, both of Switzerland

[73] Assignee: BBC Brown Boveri & Company Limited, Baden, Switzerland

[21] Appl. No.: 878,479

[22] Filed: Feb. 16, 1978

[30] Foreign Application Priority Data

Mar. 4, 1977 [CH] Switzerland .................. 2700/77

[51] Int. Cl.² ................................................ H03K 5/18
[52] U.S. Cl. .................................... 307/355; 328/97; 328/104; 328/117; 328/147
[58] Field of Search ............... 307/211, 219, 355, 357; 328/95, 96, 97, 147, 104, 117

[56] References Cited

U.S. PATENT DOCUMENTS

| 3,289,193 | 11/1966 | Worthington et al. | 307/357 X |
| 3,538,498 | 11/1970 | Game et al. | 307/211 X |
| 3,686,657 | 8/1972 | Renoulin | 307/355 X |

Primary Examiner—John Zazworsky
Attorney, Agent, or Firm—Orville N. Greene; Frank L. Durr

[57] ABSTRACT

A monitoring circuit for determining whether or not m out of n a.c. input signals meet at least one predetermined set of signal characteristics is disclosed. The circuit includes n input terminals, each for receiving a different one of the input signals being monitored. A logic circuit monitors the condition of the n input signals and generates either an a.c. or a d.c. output signal as a function of the condition of the input signals. A d.c. output signal is generated whenever m out of n input a.c. signals have maxima and minima which both lie above or both lie below a predetermined signal range corresponding to at least one of the preset signal characteristics. An a.c. output signal is generated whenever m out of n input signals have maxima and minima which respectively lie above and below the predetermined signal range.

14 Claims, 3 Drawing Figures

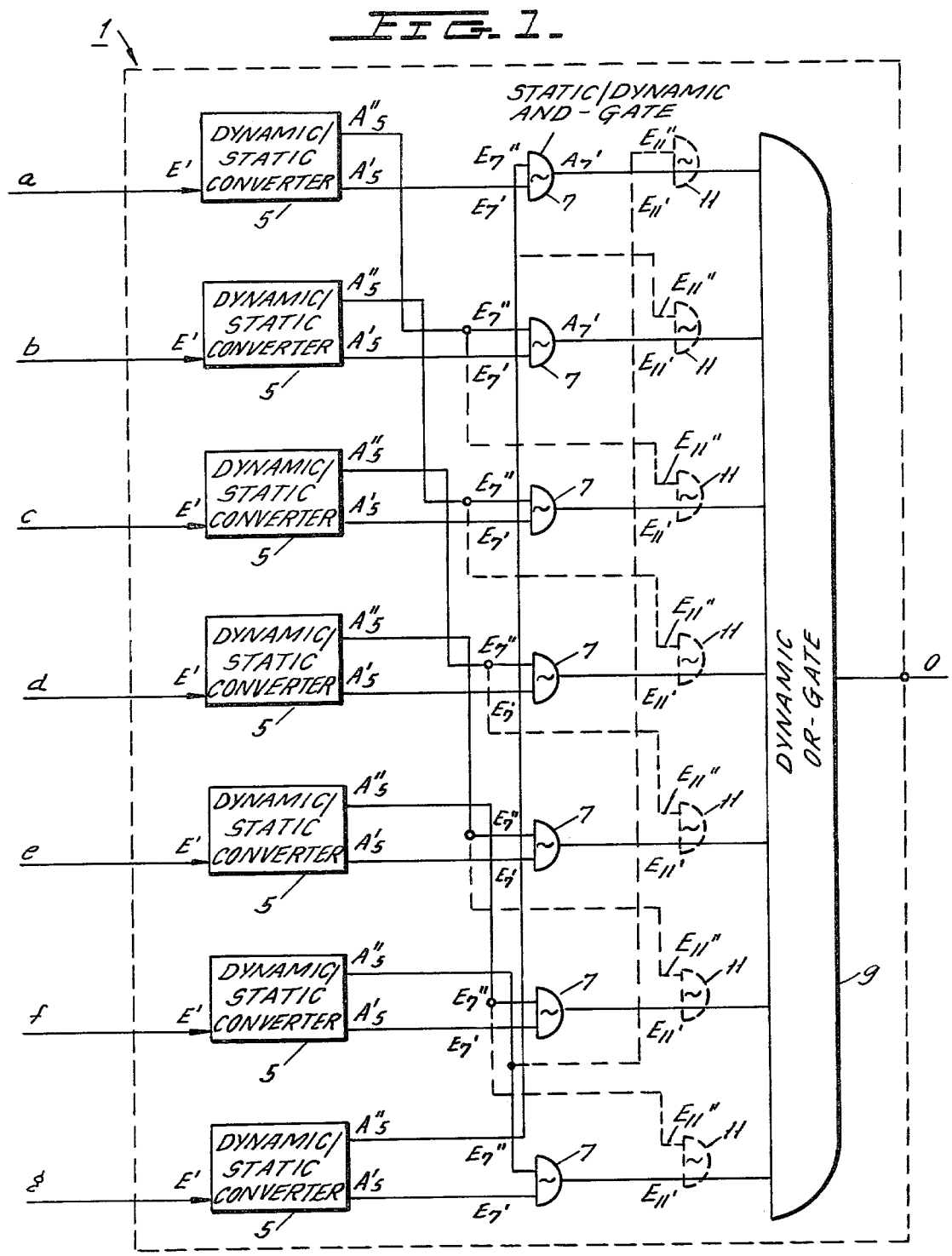
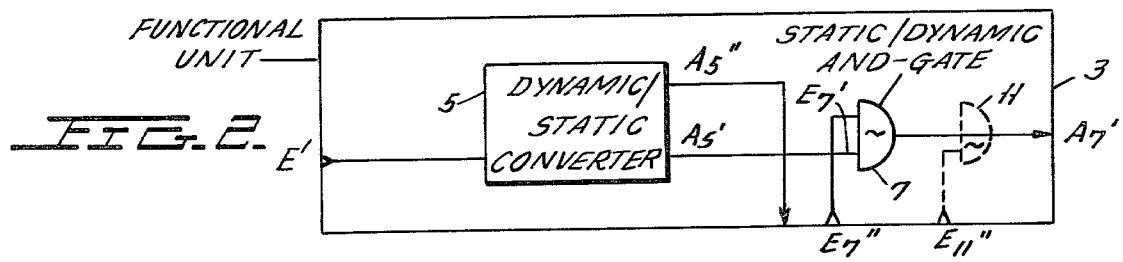

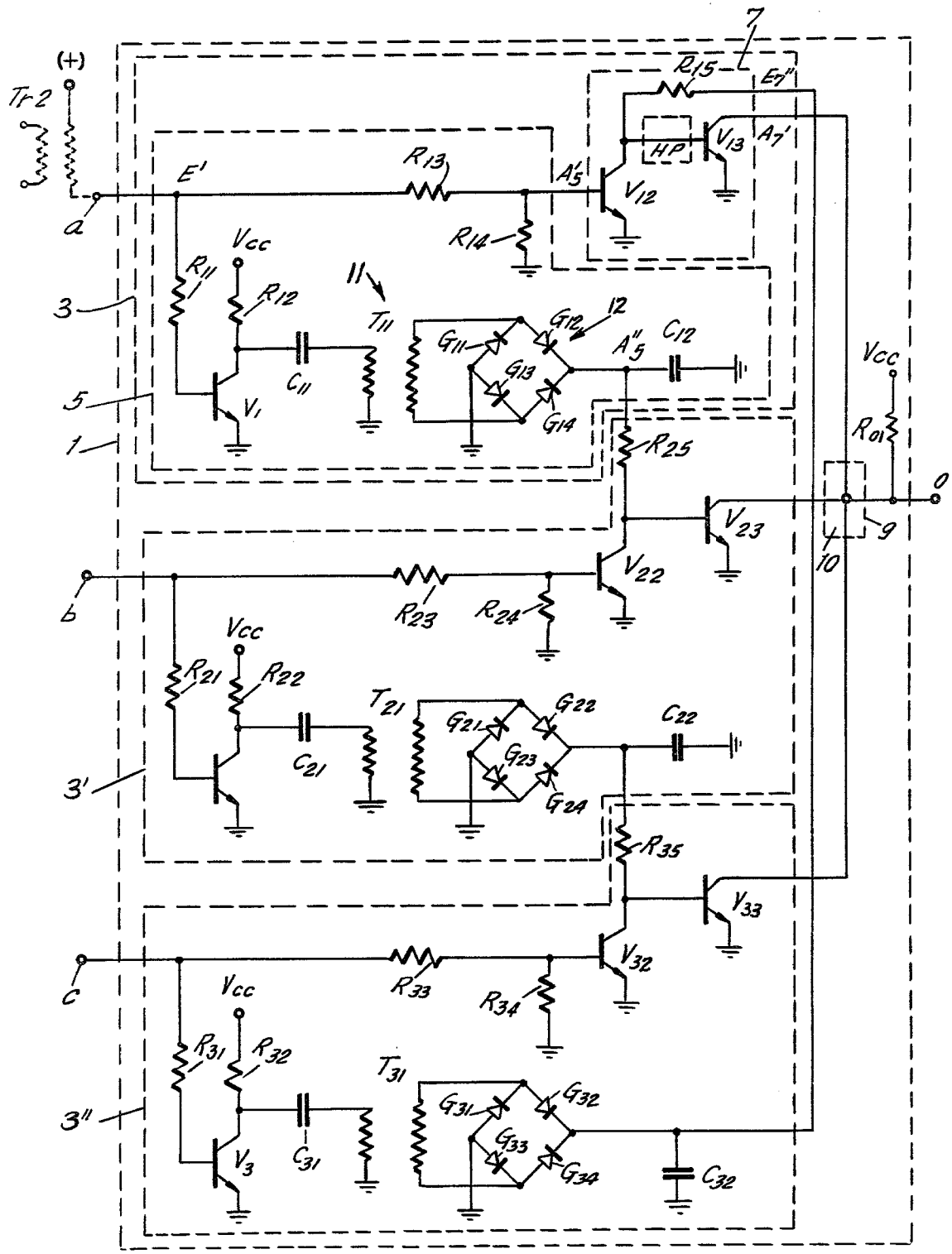

MONITORING CIRCUIT

BACKGROUND AND SUMMARY OF THE INVENTION

The invention relates to a device for detecting the simultaneous deviation of m of n alternating current (a.c.) signals from a predetermined set of signal characteristics. More particularly, the present invention relates to a monitoring circuit for generating a false condition output signal whenever m of n input signals deviate from a predetermined set of signal characteristics.

Customarily, in "failsafe" engineering a monitor network is impressed with an a.c. test signal, which appears at the network output only (if among other requirements), non element errors defined in any error catalog appear in the monitor circuit itself. Usually, to acquire and process monitored data, non-failsafe processing devices, e.g., computers also are used. In such cases, failsafety is insured by parallel-switching several of such non-failsafe devices and by monitoring their outputs with failsafe circuits.

For this purpose it is necessary to provide a monitoring circuit, which, being failsafe itself, generates a single output signal from all the output signals of the processing devices being monitored in accordance with the criterion selected. Since a.c. signals are usually used as test signals, such a monitoring circuit must generate an a.c. output signal as a function of the a.c. output signals generated by the devices being monitored.

The purpose of the present invention is to provide such a monitoring circuit. To meet above objects, the monitoring circuit of the present invention: (1) generates a direct current (d.c.) or "false" signal whenever at least m of the n a.c. input a.c.-signals simultaneously exhibit maxima and minima, which either both lie above or both lie below at least one preset signal range; and (2) generates an a.c. or "true" signal if the maxima and minima of at least m of n input signals respectively lie above and below said preset range. The monitoring circuit may also be designed to monitor additional characteristics of the input signals. For example, the monitoring circuit may be designed to generate a d.c. signal whenever m out of n input signals fall without a predetermined frequency range. As used herein, the term "preselected set of characteristics" is used to describe that set of characteristics (e.g., magnitude, frequency) of the input signals which are monitored by the monitoring circuit.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

FIG. 1 is a functional block diagram of a seven input monitoring circuit constructed according to principles of the present invention.

FIG. 2 is a functional block diagram of a functional unit utilized in the circuit of FIG. 1.

FIG. 3 is a circuit diagram of a 3 input monitoring circuit constructed in accordance with the principles of the present invention.

DETAILED DESCRIPTION OF THE INVENTION

Referring now to the drawings wherein like numerals indicate like elements, there is shown in FIG. 1 a functional block diagram of a monitoring circuit constructed in accordance with the principles of the present invention and designated generally as 1. Circuit 1 is a dynamic logic circuit which receives n (7 in the example shown) a.c. input signals and generates a d.c. ("false") output signal at its output 0 whenever at least m (6 and 5 in the two examples described below) of the n input signals do not meet a predetermined set of signal characteristics. Circuit 1 generates an a.c. ("true") signal at its output 0 at all other times.

For the purpose of describing the embodiment illustrated in FIGS. 1 and 2, the term "functional a.c. signal" will be used. A "functional a.c. signal" is an a.c. signal which meets the input requirements of the subsequent subcircuit or functional unit to which it is applied. That is, it is a signal which the following subcircuit or functional unit detects as being present, i.e. a "true" signal. The term "functional d.c. signal" will also be used. This is a d.c. signal which meets the input requirements of the subcircuit or functional unit to which it is applied. As used herein, the terms a.c. signal and functional a.c. signal shall both encompass a.c. signals which are biased by a d.c. component such that their maxima and minima both lie above or below the 0 volt level.

Monitoring circuit 1 comprises a plurality of identical functional units 3 (see FIG. 2), equal in number to the number of input signals. Each functional unit 3 has an a.c. input E', a d.c. input E'', and a.c. output $A_7'$ and a d.c. output $A_5''$. Each functional unit 3 comprises a dynamic/static converter 5, which receives a corresponding one of the a.c. input signals E' and generates a functional a.c. signal at its a.c. output $A_5'$ and a functional a d.c. signal at its d.c. output $A_5''$ whenever it detects a functional a.c. signal at its respective input E'.

The parameters of converter 5 are chosen such that it generates functional a.c. and d.c. signals at outputs $A_5'$ and $A_5''$, respectively, whenever the input signal appearing at its respective input E' meets the predetermined set of characteristics selected for any application of monitor circut 1. Accordingly, a functional a.c. signal at input E' is an a.c. signal meeting said predetermined set of characteristics. In the preferred embodiment, an a.c. signal having the same frequency as the a.c. signal at E' will always appear at the a.c. output $A_5'$. The magnitude of this a.c. signal will be proportional to the magnitude of the input signal at E'.

The a.c. output signal at output $A_5'$ is fed to a static/dynamic AND-gate 7, which also receives a d.c. input signal (at $E_7''$) from a different functional unit 3. The static/dynamic AND-gate 7 generates a functional a.c. output signal at output $A_7'$ whenever it receives a functional a.c. signal at its input $E'_7$ and a functional d.c. signal at its input $E_7''$.

As a result of the foregoing, each functional unit 3 generates a functional a.c. signal at its output $A_7'$ and a functional d.c. signal at its output $A_5''$ whenever it receives functional a.c. and d.c. signals at its inputs E' and $E_7''$, respectively.

As will be described below, the selection of m in any application of monitoring circuits 1 is made by appropriately connecting the d.c. output $A_5''$ of each functional unit 3 to the selected static inputs $E_7''$ of the remaining functional units 3. Two examples will be described with respect to FIG. 1. In the first example m is 6. In the second example, m is 5. Those skilled in the art will recognize the circuit 1 may similarly be modified for m=1, 2, 3 or 4.

Referring again to FIG. 1, a monitoring circuit for m=6 will be described. As shown in the drawings, the a.c. output $A_7'$ of each functional unit 3 is applied to a dynamic OR-gate 9. Dynamic OR-gate 9 generates an a.c. signal at output 0 of monitoring circuit 1 whenever at least one a.c. signal is applied thereto.

Whenever a signal at one of inputs E' fails to meet the preselected set of characteristics monitored by circuit 1, for example on channel a, then the converter 5 associated with the respective functional unit 3 will fail to generate functional a.c. and d.c. signals at its outputs $A_5'$ and $A_5''$, respectively. Since a functional a.c. signal is not generated by the converter 5, the static/dynamic AND-gate 7, and therefore the functional unit 3 associated with input a, will no longer generate a functional a.c. signal at its output $A_7$. Additionally, since converter 5 no longer generates a functional d.c. signal at its output $A_5''$, the functional unit 3 to which it is applied (the functional unit associated with input b) will also fail to generate a functional a.c. signal at its output $A_7'$. The result of the foregoing is that two functional units 3 will cease generating functional a.c. signals at their outputs $A_7'$ whenever a signal on any one of the inputs E' fails to meet the preselected set of characteristics. If the input signal on 6 of the seven input lines a-g fail to meet the preselected set of characteristics, none of the seven outputs $A_7'$ of functional units 3 will generate a functional a.c. signal and the output of dynamic OR-gate 9 will become static (i.e., a d.c. signal will appear at output 0).

In FIG. 1 the dashed lines illustrate the manner in which the d.c. outputs $A_5''$ of the various functional units 3 should be connected to the remaining functional units 3 to enable monitoring circuit 1 to generate a d.c. signal at output 0 at least whenever 5 of the 7 input channels a-g fail to meet the preselected signal requirements. As shown, a plurality of additional static/dynamic AND-gates 11 are utilized; one AND-gate 11 for each functional unit 3. Each AND-gate 11 receives an a.c. input signal $E_{11}'$ from the AND-gate 7 associated with the functional unit of which it forms a part and a d.c. input signal $E_{11}'$ from the d.c. output $A_5''$ of a different functional unit 3. So connected, the absence of a functional a.c. signal on any one of the plurality of channels a-g results in the absence of a functional a.c. signal at the output of three functional units. For example, if the signal on channel a fails to meet the predetermined set of characteristics monitored by circuit 1, the outputs of the functional units associated with input channels a, b and c will all fail to generate functional a.c. signals. As a result of the foregoing, the output of dynamic OR-gate 9, and therefore the output of circuit 1, will switch from an a.c. to a d.c. signal whenever 5 of the 7 input lines a-g fail to meet the preset characteristics monitored by circuit 1. In fact, if the non-functional a.c. signals are properly distributed on lines a-g, the output of dynamic OR-gate 9, and therefore the output of circuit 1, will switch from an a.c. to a d.c. signal whenever as little as 3 out of 7 inputs (e.g., inputs a, d, g) are non-functional a.c. signals.

FIG. 3 illustrates a hard wiring diagram of one possible implementation of the monitoring circuit of the present invention. The particular circuit shown is a 2 out of 3 monitor circuit which generates a d.c. or "false" output signal at its output 0 whenever 2 of the three input signals on lines a, b and c do not meet the preselected set of characteristics monitored by circuit 1. Monitoring circuit 1 comprises three identical functional units 3, 3' and 3''. Since the structure of all three functional units 3, 3' and 3'' are identical, only the structure and operation of functional unit 3 will be described. Functional unit 3 includes a dynamic/static converter 5 and a static/dynamic AND-gate 7. Converter 5 has an a.c. section defined by voltage divider $R_{13}$, $R_{14}$ and a d.c. section defined by transistor $V_1$, acceptor circuit 11 and diode bridge 12.

The a.c. section of converter 5 comprises a voltage divider $R_{13}$, $R_{14}$ whose characteristics are chosen as a function of the desired magnitude of the input signal on line a, and the transfer characteristics of transistor $V_{12}$ (to be described in greater detail below). Particularly, the ratio of voltage divider $R_{13}$, $R_{14}$ is preferably selected to ensure that:

(1) the maxima and minima of the output signal $A_5'$ are both above the saturation voltage of transistor $V_{12}$ when the maxima and minima of the input signal on line a are both above the preselected desired magnitude range thereof;

(2) the maxima and minima of the output signal $A_5'$ are respectively above and below the saturation and cutoff levels of transistor $V_{12}$ when the maxima and minima of the input signal on line a are respectively above and below the preselected desired magnitude range thereof; and (3) the maxima and minima of the output signal $A_5'$ are both below the cutoff voltage of transistor $V_{12}$, when the maxima and minima of the input signal on line a are both below the preselected desired magnitude range thereof.

The effect of the foregoing relationship is to ensure that transistor $V_{12}$ generates an a.c. output at its collector whenever the maxima and minima of the a.c. signal on line a are respectively above and below the preselected range. This condition is sufficient in the sense of insuring that whenever the maxima and minima of the a.c. signal lie within the active range of the transistor, the transistor is operated in the active range and an a.c. signal appears at the output of transistor $V_{12}$.

The d.c. section of converter 5 includes transistor $V_1$, an acceptor circuit 11 and full wave bridge rectifier 12. The signal on line a is applied to the base of transistor $V_1$ via base resistor $R_{11}$. The saturation and cutoff voltages of transistor $V_1$ define the preset desired magnitude range of input signal E'. By so selecting the characteristics of transistor $V_1$, the following relationship will exist between the input signal on line a and the output of transistor $V_1$:

(1) when the minima and maxima of the signal on line a are both above or both below the preselected signal range, the output at the collector of transistor $V_1$ will be at d.c. level (i.e., 0 volts and $V_{cc}$, respectively);

(2) when the maxima and minima of the input signal E' are respectively above and below the maxima and minima of the preselected input range, transistor $V_1$ is switched into and out of conduction according to the frequency of the input signal E' and an a.c. signal having the same frequency as input signal E' will appear at the collector of transistor E'.

As with transistor $V_{12}$, discussed above, this condition is sufficient since it ensures that in all cases in which an a.c. input signal is within the preselected operation range (e.g., the extreme points of the input signal E both lie within the preselected range) an a.c. signal having the same frequency as the input signal E will appear at the collector of transistor $V_1$. Whether a given signal amplitude then is enough to produce an a.c. signal sufficient for further functional units 3 (i.e., a functional a.c. signal) is to a large extent determined by the dynamic system performance of transformer $T_{11}$ and bridge circuit 12 as well as of the threshold value of post-switched static input $E_7''$ (i.e., the threshold voltage of transistor $V_{23}$).

The output of transistor $V_1$ is applied to an acceptor circuit 11 comprising a capacitor $C_{11}$ and the impedance of the primary winding of transformer $T_{11}$. Acceptor circuit 11 acts as a band pass filter which defines the preselected frequency range of the characteristics being monitored by circuit 1. Particularly, if the frequency of the a.c. signal at the collector of transistor $V_1$ is within the frequency band of acceptor 11, an a.c. signal of similar frequency ill appear at the input to diode bridge 12.

Diode bridge 12 comprises four diodes $G_{11}$ through $G_{14}$ and converts the a.c signal appearing across the secondary winding of transformer $T_{11}$ to the d.c. output signal $A_5''$. The parameters of the various components of the d.c. section of converter 5 are selected such that an effective d.c. signal appears at output $A_5''$ if the parameters of input signal $E'$ meet the predetermined set of characteristics monitored by circuit 1. In various applications, the a.c. signal on line a can have two acceptable specified frequencies. In such cases, the acceptor circuit is so designed that its resonance frequency is set to be maximally centered between the specified frequencies. As a result, a dynamic systems performance is insured at both frequencies for transformer $T_{11}$ and diode bridge 12. As shown in FIG. 1, the a.c. output $A_5'$ of converter 5 is fed to a static/dynamic AND-gate 7.

In the embodiment illustrated in FIG. 3, AND-gate 7 comprises two transistors $V_{12}$ and $V_{13}$. The base of transistor $V_{12}$ receives the a.c. output $A_5'$ of converter 5 while its emitter is grounded. The collector of transistor $V_{12}$ is also coupled to the base of transistor $V_{13}$. The emitter of transistor $V_{13}$ is grounded and its collector defines the AND-gate output $A_7'$.

The parameters of transistor $V_{13}$ are chosen such that it produces a functional a.c. signal at its output $A_7'$ only if: (1) transistor $V_{12}$ generates an a.c. signal at its collector; and (2) a functional d.c. signal is applied to input $E_7''$. By so selecting the parameters of transistor $V_{12}$ and $V_{13}$, transistor $V_{13}$ generates a functional a.c. signal at its output $A_7'$ only when functional a.c. and d.c. signals are applied to inputs $A_5'$ and $E_7''$, respectively.

By examining the connections between the d.c. output of converter 5 of each functional unit 3, 3' and 3" and the d.c. inputs of each AND-gate 7, it becomes apparent that each time the input signal on any monitored line a through c fails to meet the predetermined characteristics set for that line, the outputs of two AND-gate 7 will switch from an a.c. to a d.c. signal. This can best be seen by way of example. It should be assumed that the a.c. input signal on line a fails to meet the preselected set of characteristics. In such a case, both the a.c. and d.c. outputs of the converter 5 associated with functional unit 3 generates non-functional signals. The non-functional a.c. signal at output $A_5'$ is applied to the AND-gate 7 associated with functional unit 3 and the output of that AND-gate becomes d.c. Similarly, the d.c. ouput $A_5''$ of the conveter 5 associated with functional unit 3 is applied to the AND-gate 7 associated with functional unit 3' causing its output to become d.c. As a result, the output of two AND-gates 7 become d.c. whenever the input signals on 1 input line fails to meet the predetermined set of requirements. Following a similar analysis, it can be shown that the outputs of all three AND-gates 7 become d.c. whenever 2 out of 3 (generally m out of n) of the input lines a through c fail to meet the predetermined set of characteristics monitored by circuit 1.

The outputs of each of the AND-gate 7 are fed in parallel to a summing node 10 which functions as the dynamic OR-gate 9 of FIG. 1. An a.c. signal will appear at node 10 whenever an a.c. signal appears at output of any of AND-gate 7. Output 0 is preferably connected to node 10 in parallel with a biasing d.c. voltage $V_{cc}$ via a biasing resistor $R_{01}$. Resistor $R_{01}$ serves as the collector resistance for transistors $V_{13}$, $V_{23}$ and $V_{33}$. As a result, an a.c. signal fluctuating between zero and $V_{cc}$ volts appears at output 0 whenever an a.c. signal appears at the output of any AND-gate 7.

To prevent the generation of false d.c. signals at the output of OR-gate 9, it is preferable to adjust the time constants of acceptor circuit 11 and the R-C circuit comprising filter capacitor $C_{12}$ and collector resistor $R_{25}$ to be sufficiently long to prevent the functional units 3 from detecting the temporary absence of a functional a.c. signal (as a result of noise, etc.) on their respective input lines a through c.

FIG. 3 shows the need for making sure that if one of the input signals $E'$ becomes static (i.e., a d.c. signal) the corresponding output stage of AND-gate 7 stays switched to a non-conducting state. This can easily be achieved by switching elements, which are coupled between the monitoring circuit 1 and the input lines a through c. In FIG. 3, for example, such a connection for input a is shown by broken lines. As shown therein, the input signal being monitored is coupled by a transformer Tr2 to the input channel E. Particularly, the input signal on line a is applied to the primary winding of Tr2 while the secondary of Tr2 is connected between a positive biasing potential (+) and the input $E'$. This structure insures that whenever an a.c. signal fails to appear on line a, the dynamic input $E'$ of functional unit 3 receives a positive d.c.-voltage. A similar result may be obtained by d.c. like decoupling the input of transistor $V_{13}$ to the output of transistor $V_{12}$. In principle this can be achieved by a high-pass filter HP, as is drawn in broken lines in FIG. 3. When using two frequencies it is advantageous, of course, to provide a band-pass filter instead of a high-pass filter for d.c.-decoupling purposes. By taking measures such as the foregoing, it is possible to insure that the output stages $V_{13}$ of AND-gate 7 can become static only by failing to conduct.

The structure of FIG. 3 is further advantageous since it ensures that the output of monitoring circuit 1 will become d.c. There is a phase reversal of one of the input signals $E'$ relative to other input signals. An interrelated phase shift of input signals $E'$ effects a change in the timing ratio of positive and negative signal half-waves at the output 0 of monitoring circuit 1. Such an error in the performance of input signals can also be detected by appropriate analyzer means.

It should be recognized by those skilled in the art that by various counter-couplings of transistors $V_1$ and $V_{12}$, by various units 3, it is possible to establish predetermined signal characteristics other than those illustrated in the examples shown.

For the exemplified embodiment according to FIG. 3, the following preferable component values may be used:

$R_{11}$–$R_{31}$ = 3.0 kilohm
$R_{12}$–$R_{32}$ = 0.18 kilohm
$R_{13}$–$R_{33}$ = 1.5 kilohm
$R_{14}$–$R_{34}$ = 0.82 kilohm
$R_{15}$–$R_{35}$ = 5.6 kilohm
$R_{01}$ = 0.22 kilohm
$C_{11}$–$C_{31}$ = 10 nF
$C_{12}$–$C_{32}$ = 150 nF The present invention may be embodied in other specific forms without departing from the spirit or essential attributes thereof and, accordingly, reference should be made to the appended claims, rather than to the foregoing specification as indicating the scope of the invention.

What is claimed is:

1. A monitoring circuit for detecting the simultaneous deviation of m out of n a.c. input signals from a predetermined set of signal characteristics, wherein n and m are integers and n is greater than m, said circuit comprising:
   (A) n functional units, each of said functional units including an a.c. input, at least one d.c. input, an a.c. output and a d.c. output;
   (B) means for connecting a different one of said n a.c. input signals to said a.c. input of each of said functional units such that each of said functional units is associated with a different one of said a.c. signals; and
   (C) logic circuit means connected to said functional units for generating:
      (1) a d.c. output signal at least whenever m out of n input signals have maxima and minima which both lie above or both lie below a predetermined signal range corresponding to at least one of said predetermined set of signal characteristics; and
      (2) an a.c. output signal whenever all of said n input signals have maxima and minima which respectively lie above and below said predetermined signal range.

2. The monitoring circuit of claim 1, wherein each of said functional units is adapted to generate (1) a functional d.c. signal at its d.c. output when the a.c. signal associated therewith meets said predetermined set of signal characteristics, and (2) a functional a.c. signal at its a.c. output when both the a.c. signal associated therewith meets said predetermined set of signal characteristics and each of its d.c inputs receives a functional d.c signal; and wherein said logic circuit means comprises:
   (A) means for connecting the d.c. output of each of said functional units to a d.c. input of at least one of the remaining said functional units in such a manner that the d.c. inputs of each functional unit receive d.c. outputs from a different set of functional units; and
   (B) means for generating said a.c. output signal whenever at least one of said functional units generates a functional a.c. signal at its a.c. output.

3. The monitoring circuit of claim 2 wherein said means for generating said a.c. output signal is a dynamic OR-gate.

4. The monitoring circuit of claim 2 wherein each of said functional units comprise:
   (A) a static/dynamic converter for generating a functional a.c. and a functional d.c. signal when the input a.c. signal associated with said functional unit meets said predetermined set of signal characteristics;
   (B) logic means for generating a dynamic a.c. signal whenever both said static/dynamic converter generates said functional a.c. signal and each of its d.c. inputs receives a functional d.c. signal.

5. The monitoring circuit of claim 4 wherein said converter includes an a.c. section and a d.c. section.

6. The monitoring circuit of claim 5 wherein said predetermined set of characteristics includes a set of magnitude and a set of frequency characteristics and wherein said d.c. section includes:
   (A) means for generating an intermediate a.c. signal having a frequency indicative of the frequency of the a.c. input signal associated with said functional unit if said a.c. input signal meets the magnitude characteristics of said predetermined set of characteristics; and
   (B) band-pass filter means for band-pass filtering said intermediate a.c. signal and for generating a functional d.c. signal if the frequency of said intermediate signal indicates that the frequency of said a.c. input signal meets the frequency characteristics of said predetermined set of signal characteristics.

7. The monitoring circuit of claim 6 wherein said band-pass filter means comprises a band-pass filter and a rectifier circuit.

8. The monitoring circuit of claim 7 wherein said band-pass filter has a frequency range sufficient to pass at least two predetermined frequencies, which predetermined frequencies correspond to permissible frequencies of said a.c. input signals.

9. The monitoring circuit of claim 2 wherein said means for connecting the d.c. output of each of said functional units to the d.c. input of at least one of said remaining functional units determines the value of m as a function of the number of functional units in each of said set of functional units.

10. The monitoring circuit of claims 5 or 6 wherein said a.c. section comprises a voltage divider.

11. The monitoring circuit of claim 4 wherein each of said logic means comprises a static/dynamic AND-gate having a first input which receives said functional a.c. signal generated by said converter and a second input which receives one of said d.c. inputs of said functional unit and which generates a functional a.c. output whenever a functional a.c. input and functional d.c. input signal is applied thereto.

12. The monitoring circuit of claim 11 wherein said static/dynamic AND-gate comprises a first and a second switching element, the control input of said first switching element receiving said functional a.c. signal generated by said converter, the control input of said second switching element receiving both the output of said first switching element and one of said at least one d.c. inputs.

13. The monitoring circuit of claim 2 wherein a change in frequency of any of said a.c. input signals results in a change in the frequency of the functional a.c. signal generated by at least one of said functional units.

14. The monitoring circuit of claim 2 wherein a change in phase of any of said a.c. input signals results in a change in the phase of the functional a.c. signal generated by at least one of the functional units.

* * * * *